US008698576B2

(12) United States Patent
Hung et al.

(10) Patent No.: US 8,698,576 B2
(45) Date of Patent: Apr. 15, 2014

(54) ISOLATED ZERO DEGREE REACTIVE RADIO FREQUENCY HIGH POWER COMBINER

(75) Inventors: Liang Hung, Short Hills, NJ (US); Michael Hodgetts, Long Valley, NJ (US)

(73) Assignee: Alcatel Lucent, Paris (FR)

(*) Notice: Subject to any disclaimer, the term of this patent is extended or adjusted under 35 U.S.C. 154(b) by 290 days.

(21) Appl. No.: 13/095,178

(22) Filed: Apr. 27, 2011

(65) Prior Publication Data
US 2012/0274414 A1    Nov. 1, 2012

(51) Int. Cl.
*H01P 5/12*    (2006.01)

(52) U.S. Cl.
USPC ............ 333/125; 333/128; 333/134; 333/136

(58) Field of Classification Search
USPC .................................................. 333/125–136
See application file for complete search history.

(56) References Cited

U.S. PATENT DOCUMENTS

| | | | |
|---|---|---|---|
| 3,769,586 A | | 10/1973 | Shapiro et al. |
| 4,163,955 A | * | 8/1979 | Iden et al. ............... 333/127 |
| 4,401,952 A | | 8/1983 | Basawapatna |
| 4,547,745 A | * | 10/1985 | Freitag et al. ............ 330/286 |
| 4,785,267 A | * | 11/1988 | Covill ..................... 333/125 |
| 6,078,227 A | * | 6/2000 | Buer et al. ............... 333/117 |
| 6,111,476 A | * | 8/2000 | Williamson ............. 333/109 |
| 2001/0040485 A1 | * | 11/2001 | Do et al. ................. 333/101 |

OTHER PUBLICATIONS

Hayashi, H., et al.: "Millimeter-Wave-Band Amplifier and Mixer MMIC's Using a Broad-Band 45 DEG Power Divider/Combiner," IEEE Transactions on Microwave Theory and Techniques, IEEE Service Center, Piscataway, NJ, US, vol. 46, No. 6, Jun. 1, 1998, pp. 811-819, XP000754875, ISSN: 0018-9480.
A-L. Perrier, et al.: "A Semi-Lumped Miniaturized Spurious Less Frequency Tunable Three-Port Divider/Combiner With 20 dB Isolatoin Between Output Ports," Microwave Symposium Digest, 2006. IEEE MTT-S Internatoinal, IEEE, PI, Jun. 1, 2006, pp. 1714-1717, XP031018817.
International Search Report and Written Opinion of the International Searching Authority for International application No. PCT/US2012/034640 dated Jul. 26, 2012.

* cited by examiner

*Primary Examiner* — Robert Pascal
*Assistant Examiner* — Kimberly Glenn
(74) *Attorney, Agent, or Firm* — Carlson, Gaskey & Olds

(57) ABSTRACT

An exemplary communication device includes a combiner having a first transmission line configured to be coupled with a first communication component. A second transmission line is configured to be coupled with a second communication component. A third transmission line is coupled with the first and second transmission lines. An isolation module is coupled with the first and second transmission lines. The isolation module has a resistance, a capacitance and an inductance configured to isolate the first communication component from the second communication component if one of the components is inoperative. The isolation module components are also configured to provide RF matching for the first and second transmission lines if one of the components is inoperative.

17 Claims, 1 Drawing Sheet

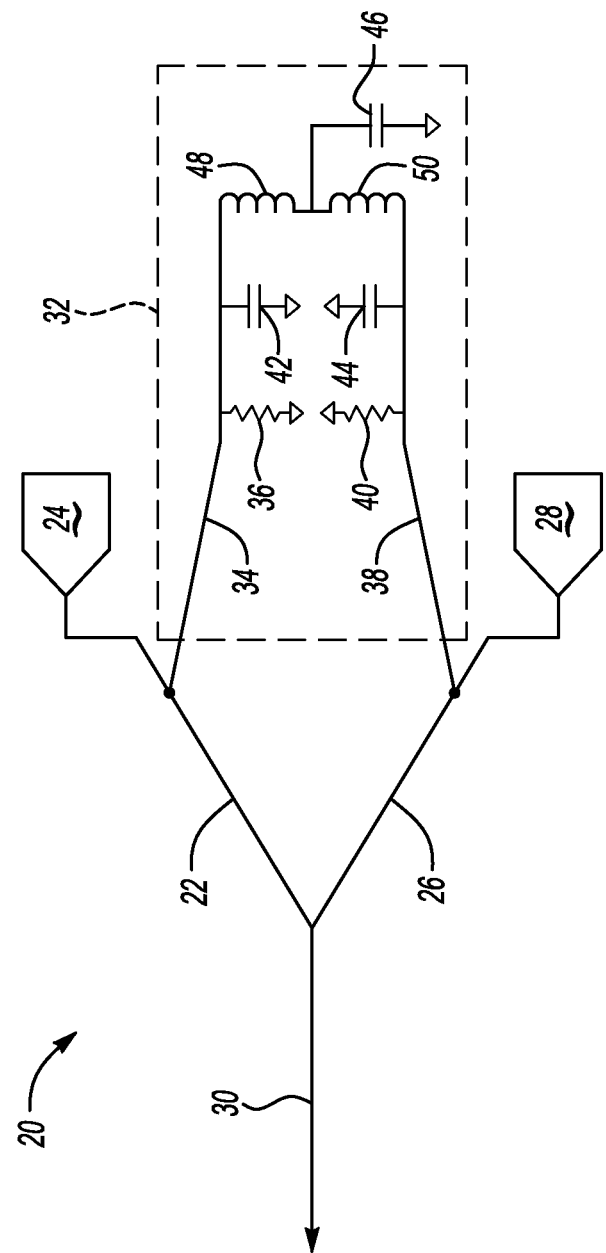

US 8,698,576 B2

ISOLATED ZERO DEGREE REACTIVE RADIO FREQUENCY HIGH POWER COMBINER

FIELD OF THE INVENTION

This invention generally relates to communication. More particularly, this invention relates to combining signals for communication.

DESCRIPTION OF THE RELATED ART

Within communication systems there are a variety of uses for combining signals. For example, zero degree reactive combining and ninety degree hybrid schemes have been used to realize multi-carrier power amplifier (MCPA) and balanced power amplifier (PA) or low noise amplifier (LNA) arrangements. There are tradeoffs and limitations associated with known approaches. For example, ninety-degree hybrid schemes with a multi-layer broad side structure for manufacturability provides port isolation but suffers from lower peak power handling and relatively high cost. Therefore, ninety-degree hybrid schemes are not a favorable choice for frame level applications. On the other hand, reactive combiners have limited port isolation. Therefore, when used in an MCPA arrangement, such combiners introduce the possibility that the failure of one amplifier causes problems for another amplifier. In other words, the remaining RF power when one amplifier is inoperative is partially lost as the result of the reactive combiner's unmatched condition when one of the amplifiers fails.

A Wilkinson type radio frequency combiner including a port cross over resistor can address the port isolation issue. Wilkinson type combiners, however, introduce additional radio frequency loss and port spacing restrictions because of the cross over resistor's capacitance to ground. Wilkinson type combiners are, therefore, not considered useful for frame level, high power applications. Other types of known combiners such as branch line combiners and broad side combiners provide good port isolation but have the drawbacks of difficult layout and manufacturing, relatively high RF loss and relatively high cost.

SUMMARY

An exemplary communication device includes a combiner having a first transmission line configured to be coupled with a first communication component. A second transmission line is configured to be coupled with a second communication component. A third transmission line is coupled with the first and second transmission lines. An isolation module is coupled with the first and second transmission lines. The isolation module has a resistance, a capacitance and an inductance configured to isolate the first communication component from the second communication component if one of the components is inoperative. The isolation module components are also configured to provide RF matching for the first and second transmission lines if one of the components is inoperative.

The various features and advantages of a disclosed example will become apparent to those skilled in the art from the following detailed description. The drawing that accompanies the detailed description can be briefly described as follows.

BRIEF DESCRIPTION OF THE DRAWING

FIG. 1 schematically illustrates an example communication device designed according to an embodiment of this invention.

DETAILED DESCRIPTION

FIG. 1 schematically shows a communication device including a combiner 20. A first transmission line 22 is configured to be coupled with a first communication component 24. A second transmission line 26 is configured to be coupled with a second communication component 28.

A third transmission line 30 is coupled with the first transmission line 22 and the second transmission line 26. Signals from the communication components 24 and 28 are combined into a combined signal propagated along the third transmission line 30.

In one example, the communication components 24, 28 comprise amplifiers and the combiner 20 is used for multiple carrier power amplifier (MCPA) combining In one example, the communication components 24 and 28 comprise amplifiers of a wireless communication system macrocell base station. The example combiner 20 allows for combining signals from such amplifiers with high power and low loss.

When both of the communication components 24 and 28 are operating in an acceptable manner, the resulting combined signal on the third transmission line 30 has desired characteristics. Under some circumstances it is possible for one of the communication components 24 or 28 to malfunction or otherwise fail to operate as desired (i.e., to become inoperative at least temporarily). The illustrated example includes an isolation module 32 that isolates the communication components 24 and 28 from each other so that when one of them becomes inoperative, that does not have a negative impact on the performance of the other. The isolation module 32 includes a resistance, a capacitance and an inductance for isolating the communication components 24 and 28 from each other if one of them becomes inoperative. The isolation module 32 also provides matching between the first transmission line 22 and the second transmission line 26 if one of the components 24 or 28 becomes inoperative.

The example isolation module 32 includes a fourth transmission line 34. A first resistor 36 is coupled between the fourth transmission line 34 and ground. The isolation module 32 also includes a fifth transmission line 38 that is coupled to the second transmission line 26. A second resistor 40 is coupled between the fifth transmission line 38 and ground. A first capacitor 42 is in parallel with the first resistor 36 and coupled between the fourth transmission line 34 and ground. A second capacitor 44 is in parallel with the first resistor 40 and coupled between the fifth transmission line 38 and ground. A third capacitor 46 is in parallel with the first capacitor 42 and the second capacitor 44.

A first inductor 48 is in parallel with the first capacitor 42 and the first resistor 36. The first inductor 48 is coupled between the fourth transmission line 34 and the third capacitor 46. The first inductor 48 is in series with the third capacitor 46 with the third capacitor between the first inductor 48 and ground. A second inductor 50 is in parallel with the second capacitor 44 and the second resistor 40. The second inductor 50 is coupled between the fifth transmission line 38 and the third capacitor 46. The second inductor 50 is in series with the third capacitor 46.

In one example, low cost micro-stripe line or stripe line manufacturing techniques can be used to realize an isolation module consistent with the illustrated example. The example arrangement of isolator module components renders it useful in situations where relatively large spacing may be required between the inputs.

The components of the isolation module 32 are considered passive. When both of the communication components 24 and 28 are operating as expected or desired, the same voltage, phase and amplitude is present on each of the first transmission line 22 and the second transmission line 26. Under such conditions, the passive elements of the isolation module 32 do not have any impact on the performance of the combiner 20 or the communication components 24 and 28.

If one of the communication components 24 or 28 should become inoperative, the passive components provide RF matching at the junction between the isolation module and the transmission lines 22 and 26, respectively. RF matching between the coupling of the fourth transmission line 34 and the first transmission line 22 on the one hand and the coupling of the second transmission line 26 and the fifth transmission line 38 on the other hand ensures that one coupling is matched regardless of the input at the other. For example, the resistor 36, capacitors 42 and 46 and the inductor 48 match for the first transmission line 22 (50 Ohm) and the first communication component 24 (50 Ohm). Similarly, the resistor 40, the capacitors 44 and 46 and the inductor 50 match for the second transmission line 26 (50 Ohm) and the second communication component 28 (50 Ohm). The RF matching results in RF isolation of the communication components 24 and 28 from each other so that if one of them becomes inoperative, it does not have a negative impact on the other.

The illustrated example minimizes loss by having the components of the isolation module 32 tuned to resonate at the operating frequency of the first and second transmission lines to avoid undesired capacitance showing at the junction between the first transmission line 22 and the fourth transmission line 34, for example. This is different than other combiners, such as a Wilkinson combiner, in which undesired capacitance cannot be avoided because of the cross-over resistor. The unique arrangement and combination of the components of the isolation module 32 avoids such undesired capacitance to provide the desired matching and isolation while minimizing loss.

The resistance of the isolation module 32 absorbs power that is otherwise problematic if one of the components 24 or 28 fails to function as desired. The inductance and capacitance of the isolation module 32 resonate at the operating frequency to provide the RF matching. The power absorption and RF matching provide isolation with reduced power loss.

In one example, the combiner 20 is used for 800 MHz cellular wireless communications. In that example, the first communication component 24 is an amplifier that can be considered a 50 Ohm system or component. The second communication component 28 is also an amplifier that can be considered a 50 Ohm system or component. In one such example, the first transmission line 22 and the second transmission line 26 are each a 50 Ohm, ninety degree transmission line. The third transmission line 30 is a 35 Ohm, ninety degree transmission line and the combined signal from the third transmission line 30 is matched to a 50 Ohm system.

The fourth transmission line 34 and the fifth transmission line 38 are each a 35 Ohm, ninety degree transmission line. The first resistor 36 has a resistance that is equal to the resistance of the second resistor 40. In one example, each of those resistors has a 25 Ohm resistance. That resistance provides for the ability to achieve quarter wavelength matching (e.g., 35 Ohms=SQRT (50 Ohms×25 Ohms)).

In one such example, the first capacitor 42 has a capacitance that is equal to the capacitance of the second capacitor 44. In one example, that capacitance is 7.96 pF. The first inductor 48 has an inductance that is equal to the inductance of the second inductor 50. In one example useful for 800 MHz communication signals, that inductance is equal to 4.975 nH. The capacitance of the third capacitor 46 in one such example is 15.92 pF.

While example values are provided for an arrangement including 50 Ohm communication components and cellular communication signals of 800 MHz, other component values will prove useful for a given situation. Those skilled in the art who have the benefit of this description will realize how to optimize the values of the components within the isolation module 32 to meet the needs of their particular situation.

The illustrated example accommodates high power applications, provides RF isolation and minimizes transmission loss. Additionally, the illustrated example provides a feasible design implementation that allows for a relatively low cost solution. The illustrated example provides sufficient isolation of the input ports (e.g., the couplings between the communication components 24 and 28 and the transmission lines 22 and 26, respectively) to ensure RF power transmission at one amplifier in the event that another should become inoperative. Additionally, that isolation is available along with a minimal main path RF loss. In one example, the illustrated arrangement provides a main path loss advantage on the order of 0.15 to 0.2 dB compared to other known combiners that provide isolation. In wireless communications, for example, a 0.5 dB loss is considered significant so that any reduction in the main path loss is considered valuable. For example, reducing the main path loss by about 0.2 dB translates into a several hundred watt DC savings for a macrocell base station transceiver (BTS). The illustrated example, therefore, makes it possible to implement MCPA in macrocell BTSs while avoiding the shortcomings and drawbacks of previous combiners.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:
1. A communication device, comprising:
a combiner including
a first transmission line configured to be coupled with a first communication component;
a second transmission line configured to be coupled with a second communication component;
a third transmission line coupled with the first and second transmission lines; and
an isolation module coupled with the first and second transmission lines, the isolation module having a resistance, a capacitance and an inductance configured to isolate the first communication component from the second communication component if one of the components is inoperative and provide RF matching for the first and second transmission lines if one of the components is inoperative;
wherein the isolation module comprises
a fourth transmission line coupled with the first transmission line;
a first resistor coupled between the fourth transmission line and ground;
a fifth transmission line coupled with the second transmission line; and
a second resistor coupled between the fifth transmission line and ground.

2. The device of claim 1, wherein the resistance comprises a first resistance of the first resistor and a second resistance of the second resistor, and wherein the first resistance is equal to the second resistance.

3. The device of claim 1, wherein
the first transmission line comprises a 50 Ohm transmission line;
the fourth transmission line comprises a 35 Ohm transmission line; and
the first resistance is 25 Ohms.

4. The device of claim 3, wherein
the second transmission line comprises a 50 Ohm transmission line;
the fifth transmission line comprises a 35 Ohm transmission line; and
the second resistance is 25 Ohms.

5. The device of claim 3, wherein the third transmission line comprises a 35 Ohm transmission line.

6. The device of claim 1, wherein the isolation module comprises
a first capacitor in parallel with the first resistor between the fourth transmission line and ground;
a second capacitor in parallel with the second resistor between the fourth transmission line and ground;
a third capacitor in parallel with the first and second capacitors; and
at least one inductor in series with the third capacitor between the first and second capacitors and the third capacitor.

7. The device of claim 6, wherein the third capacitor is coupled between the at least one inductor and ground.

8. The device of claim 6, wherein the at least one inductor comprises
a first inductor in parallel with the first capacitor between the first capacitor and the third capacitor; and
a second inductor in parallel with the second capacitor between the second capacitor and the third capacitor.

9. The device of claim 8, wherein the inductance comprises a first inductance of the first inductor and a second inductance of the second inductor, and wherein the first inductance is equal to the second inductance.

10. The device of claim 6, wherein the capacitance comprises a first capacitance of the first capacitor and a second capacitance of the second capacitor, and wherein he first capacitance is equal to the second capacitance.

11. A communication device, comprising:
a combiner including
a first transmission line configured to be coupled with a first communication component;
a second transmission line configured to be coupled with a second communication component;
a third transmission line coupled with the first and second transmission lines; and
an isolation module coupled with the first and second transmission lines, the isolation module having a resistance, a capacitance and an inductance configured to isolate the first communication component from the second communication component if one of the components is inoperative and provide RF matching for the first and second transmission lines if one of the components is inoperative wherein the isolation module comprises
a fourth transmission line coupled with the first transmission line;
a first resistor coupled between the fourth transmission line and ground;
a fifth transmission line coupled with the second transmission line;
a second resistor coupled between the fifth transmission line and ground;
a first capacitor in parallel with the first resistor between the fourth transmission line and ground;
a second capacitor in parallel with the second resistor between the fourth transmission line and ground;
a third capacitor in parallel with the first and second capacitors;
a first inductor in parallel with the first capacitor between the first capacitor and the third capacitor; and
a second inductor in parallel with the second capacitor between the second capacitor and the third capacitor.

12. The device of claim 11, wherein the third capacitor is coupled between the first inductor and ground.

13. The device of claim 11, wherein
the capacitance comprises a first resistance of the first resistor and a second resistance of the second resistor;
the inductance comprise a first inductance of the first inductor and a second inductance of the second inductor;
a capacitance comprises a first capacitance of the first capacitor and a second capacitance of the second capacitor;
the first resistance is equal to the second resistance;
the first inductance is equal to the second inductance; and
the first capacitance is equal to the second capacitance.

14. The device of claim 13, wherein
the first and second transmission lines each comprise a 50 Ohm transmission line;
the fourth and fifth transmission lines each comprise a 35 Ohm transmission line;
the third transmission line comprises a 35 Ohm transmission line; and
the second resistance is 25 Ohms.

15. A communication device, comprising:
a combiner including
a first transmission line configured to be coupled with a first communication component;
a second transmission line configured to be coupled with a second communication component;
a third transmission line coupled with the first and second transmission lines; and
an isolation module coupled with the first and second transmission lines, the isolation module having a resistance, a capacitance and an inductance configured to isolate the first communication component from the second communication component if one of the components is inoperative and provide RE matching for the first and second transmission lines if one of the components is inoperative,
wherein the isolation module
isolates the first communication component from the second communication and provides RF matching for the first and second transmission lines without introducing capacitance at a coupling between the isolation module and the first transmission line and at a coupling between the isolation module and the second transmission line.

16. A communication device, comprising:
a combiner including
a first transmission line configured to be coupled with a first communication component;
a second transmission line configured to be coupled with a second communication component;
a third transmission line coupled with the first and second transmission lines; and
an isolation module coupled with the first and second transmission lines, the isolation module having a resistance, a capacitance and an inductance configured to isolate the first communication component from the second communication component if one of the components is inoperative and provide RE matching for the first and second transmission lines if one of the components is inoperative, wherein the capacitance and the inductance of the isolation module resonate at an operating frequency of the first transmission line to avoid undesired capacitance showing at a coupling between the first transmission line and the isolation module and wherein the isolation module comprises a first capacitor and a first inductor tuned to resonate at the operating frequency of the first transmission line, and a second capacitor and a second inductor tuned to resonate at an operating frequency of the second transmission line.

17. The device of claim 16, wherein the capacitance and the inductance of the isolation module resonate at an operating frequency of the second transmission line to avoid undesired capacitance showing at a coupling between the second transmission line and the isolation module.

* * * * *